US005536970A

United States Patent [19]

Higashi et al.

[11] Patent Number: 5,536,970
[45] Date of Patent: Jul. 16, 1996

[54] RESIN-ENCAPSULATED SEMICONDUCTOR DEVICE

[75] Inventors: Michiya Higashi, Kawasaki; Cao M. Thai, Yokohama, both of Japan

[73] Assignee: Kabushiki Kaisha Toshiba, Kawasaki, Japan

[21] Appl. No.: 330,215

[22] Filed: Oct. 27, 1994

Related U.S. Application Data

[63] Continuation of Ser. No. 128,140, Sep. 29, 1993, abandoned.

[30] Foreign Application Priority Data

Sep. 29, 1992 [JP] Japan .................. 4-260041
Sep. 30, 1992 [JP] Japan .................. 4-261339

[51] Int. Cl.⁶ .................. H01L 23/50; H01L 23/28
[52] U.S. Cl. .................. 257/676; 257/783; 257/790
[58] Field of Search .................. 257/783, 782, 257/790–796, 792, 788, 676, 668

[56] References Cited

U.S. PATENT DOCUMENTS

| 5,049,976 | 9/1991 | Demmin et al. | 257/782 |
|---|---|---|---|
| 5,140,404 | 8/1992 | Fogel et al. | 257/783 |
| 5,173,765 | 12/1992 | Nakayoshi et al. | 257/788 |

FOREIGN PATENT DOCUMENTS

| 63-65655 | 3/1988 | Japan | 257/676 |
|---|---|---|---|
| 63-293964 | 11/1988 | Japan | 257/783 |
| 1-147836 | 6/1989 | Japan | 257/783 |
| 1-205454 | 8/1989 | Japan | 257/676 |
| 2-308557 | 12/1990 | Japan | 257/792 |
| 3-22465 | 1/1991 | Japan | 257/676 |
| 3-44040 | 2/1991 | Japan | 257/676 |
| 3-256352 | 11/1991 | Japan | 257/676 |
| 3-257854 | 11/1991 | Japan | 257/676 |

*Primary Examiner*—Donald L. Monin, Jr.
*Attorney, Agent, or Firm*—Oblon, Spivak, McClelland, Maier & Neustadt

[57] ABSTRACT

A resin-encapsulated semiconductor device having a semiconductor chip mounted on a die pad with a die bonding portion interposed, a lead arranged in a periphery of the die pad and electrically connected with a bonding pad portion of the semiconductor chip, and an encapsulating resin layer which encapsulates the semiconductor chip so that a part of the lead is guided to the outside, wherein an adhesive resin layer is interposed at least either between the die pad and the die bonding portion is described, or between the semiconductor chip and the die bonding portion.

22 Claims, 3 Drawing Sheets

RESIN-ENCAPSULATED SEMICONDUCTOR DEVICE

This application is a continuation of application Ser. No. 08/128,140 filed on Sep. 29, 1993, now abandoned.

BACKGROUND OF THE INVENTION

1. Field of the Invention

The present invention relates to a resin-encapsulated semiconductor device wherein a semiconductor chip is encapsulated by an encapsulating resin.

2. Description of the Related Art

Recently, there have been developed a thin resin-encapsulated package for a surface mounting such as a quad flat package (QFP), a plastic-lead chip carrier (PLCC), and a small outline J-bent package (SOJ) with an increase in density of a semiconductor device.

These resin-encapsulated semiconductor devices generally have a structure in which a semiconductor chip is encapsulated by various kinds of encapsulating resins. Detailedly, a semiconductor device is encapsulated in such a state that semiconductor chip is mounted on a die pad of a lead flame with a die bonding portion interposed, and furthermore, a bonding pad on the upper surface of the semiconductor chip is connected electrically with an inner lead of the lead flame by a bonding wire.

When being mounted on the substrate, these resin-encapsulated semiconductor device is left in such a high temperature condition as about 200° C. or more. At that time, since moisture absorbed in the inner part of the encapsulating resin layer is abruptly vaporized to generate a high pressure, if, for example, there is any pealed portion due to poor bonding in the interface between respective members in the inner part of the encapsulating resin layer, expansion or cracks are caused and the reliability to the moisture resistance is extremely deteriorated.

In order to solve these problems, there have been proposed various methods, for example, a method disclosed in Japanese Unexamined Patent Publication No. 63-179554, in which an adhesiveness between a die pad and an encapsulating resin layer is improved by forming a polyimide-based resin film on the lower surface of the die pad, a method disclosed in Japanese Unexamined Patent Publication No. 1-261853, in which by interposing an adhesive resin film in the interface between the whole surface of the inner lead, the lower and side faces of the die pad, the whole surface of the bonding wire, and the upper and side faces of the semiconductor chip and the encapsulating resin layer, an adhesiveness between the above-mentioned respective members and the encapsulating resin is improved, and a method disclosed in Japanese Unexamined Patent Publication No. 3-22465, in which by forming a polyimide-based resin film on the upper face of the semiconductor chip and on the lower face of the die pad, an adhesiveness between these members and the encapsulating resin layer is improved.

These methods, however, cannot improve an adhesiveness of the interface between the die pad and the die bonding portion where the adhesiveness is especially readily deteriorated, due to the intrusion of the water absorbed through the interface between the lead frame and the encapsulating resin layer. In the die bonding portion, there have been conventionally selected materials which can mitigate the stress caused by the difference of the thermal expansion coefficient between a semiconductor chip and a die pad. When such materials are used in the die bonding portion and a semiconductor chip is simply mounted through the die bonding portion, an adhesiveness in the said interface is extremely deteriorated in the high temperature and high humidity condition. Therefore, pealing is caused in the interface between said die bonding portion and the die pad at the time of surface mounting, and finally, expansion and cracks in the encapsulating resin layer are caused.

Furthermore, in such a semiconductor device, there are some problems, in many cases, in the property of the die bonding agent which forms the die bonding portion. As a die bonding agent, there have conventionally used in general a resin paste in which a curing agent, a reactive diluent, a low stress-imparting agent, a solvent, an electroconductivity-imparting agent and the like are incorporated into a resin such as an epoxy resin and a polyimide-based resin. In a conventional resin-encapsulated semiconductor device which uses such a die bonding agent, however, thermal stress is unevenly imposed on the semiconductor chip particularly in the heat-refrigerating step at the surface mounting process to cause pealing in the interface between the semiconductor chip and the die bonding portion, and expansion and cracks are easily caused in the encapsulating resin layer.

SUMMARY OF THE INVENTION

The present invention has been completed under this background. It is therefore a primary object of the present invention to provide a resin-encapsulated semiconductor device which has few cracks in the encapsulating resin layer and excellent reliability on the moisture resistance when it being mounted on the substrate.

The above object can be attained by the first and the second resin-encapsulated semiconductor devices of the present invention described below.

The first semiconductor device of the present invention has a semiconductor chip mounted on a die pad with a die bonding portion interposed, a lead arranged in a periphery of the die pad and electrically connected with a bonding pad portion of the semiconductor chip, and an encapsulating resin layer which encapsulates the semiconductor chip so that a part of the lead is guided to the outside, wherein an adhesive resin layer is interposed at least either between the die pad and the die bonding portion, or between the semiconductor chip and the die bonding portion.

In the first resin-encapsulated semiconductor device, by an adhesive resin layer interposed between a die bonding portion and an upper surface of a die pad and/or between a die bonding portion and a lower surface of a semiconductor chip, the intrusion of moisture into these parts is prevented, and fine convexities and concavities on the upper surface of the die pad and/or the lower surface of the semiconductor chip can be leveled to drastically improve the bondability. Therefore, in the interface between the die bonding portion and the die pad and/or the semiconductor chip, the deterioration of an adhesiveness in the high temperature and high moisture condition can be suppressed and pealing is not easily caused. And the expansion from the interface and cracks in the encapsulating resin layer is reduced.

Particularly recently, as the semiconductor chip becomes large because of the high-density integration, the thermal stress caused by the difference of the thermal expansion coefficient between the semiconductor chip and the lead frame is strongly added to the interface between the die bonding portion and the die pad, and between the die bonding portion and the semiconductor chip. Thus, pealing is readily caused in these parts. Accordingly, it is most effective for the prevention of pealing to provide an adhesive resin layer in the interfaces.

Furthermore, the second resin-encapsulated semiconductor device of the present invention has a semiconductor chip mounted on a die pad with a die bonding portion interposed, a lead arranged in a periphery of the die pad and electrically connected with a bonding pad portion of the semiconductor chip, and a encapsulating resin layer which encapsulates the semiconductor chip so that a part of the lead is guided to the outside, wherein the thermal expansion coefficient of the die bonding agent which constitutes the die bonding portion is in the range of ±50% of the thermal expansion coefficient of the encapsulating resin layer.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE PREFERRED EMBODIMENTS

Figure 1:
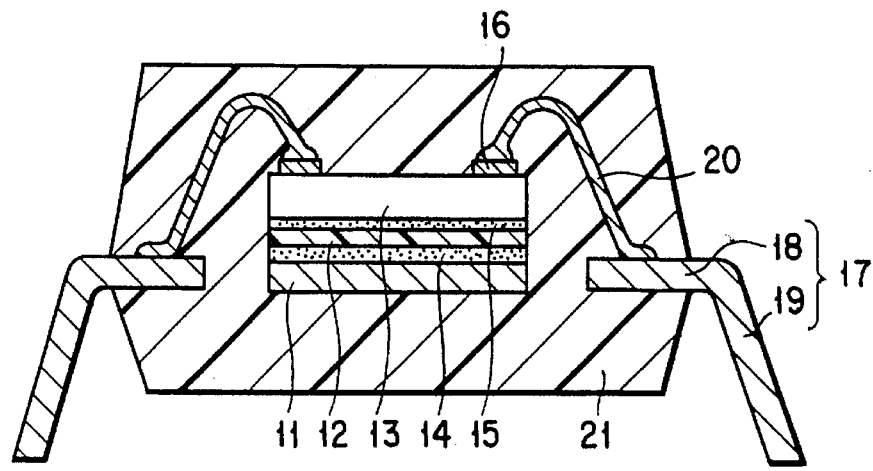
FIG. 1 is a sectional view illustrating the structure of one embodiment of the first resin-encapsulated semiconductor device of the present invention which has adhesive resin layers respectively in the interfaces of the die bonding portion and the die pad, and the die bonding portion and the semiconductor chip.

The first resin-encapsulated semiconductor device of the present invention will be described in detail below.

In the first resin-encapsulated semiconductor device of the present invention, the thickness of the adhesive resin layer can be properly set so as to generate an adhesiveness in the degree that pealing is not caused at the surface mounting, but it is preferred that the thickness be about 20 um or less. If the thickness exceeds 20 um, the total thickness of the adhesive resin layer and the die bonding portion becomes too large, and a problem of the bondability is caused. Furthermore, in the trend of thinning of the package, the thickness of the encapsulating resin layer must be thinned in order to put it in the package, which decreases the mechanical strength in the encapsulating resin layer, and no good results can be obtained.

The adhesive resin layer is preliminarily formed on the upper face of the die pad and/or the lower face of the semiconductor chip, and subsequently the semiconductor device is assembled. The forming method of the adhesive resin layer is not particularly limited, but there can be mentioned, for example, a method in which an adhesive resin layer in a varnish state is cast on the upper face of the die pad and/or the lower face of the semiconductor chip and thinned by means of a spinner or the like, a method in which an adhesive resin is sprayed by means of a spray, a method in which an adhesive resin is printed, and a method in which an adhesive resin is applied by using a brush and the like.

The adhesive resin layer can be formed in the whole face or in part of the interface between the die bonding portion and the die pad and/or the semiconductor chip. In the latter case, there can be concretely mentioned various shapes such as a stripe, i.e., lines having a suitable space from each other, a round shape and a square shape. With regard to a flat shape of the adhesive resin layer, it should be suitably set so as to impart an adhesiveness in the degree that pealing is not caused at the surface mounting.

As the materials for the adhesive resin layer, among thermosetting resins, photosetting resins and thermoplastic resins, those which can prevent the intrusion of moisture to the interface of the die pad and/or the semiconductor chip and the die bonding portion, i.e., which have a damp proof effect and in which an adhesiveness to the upper face of the die pad and/or the lower face of the semiconductor chip is higher than that of the die bonding agent are selected and used singly or in combination of two or more of them. Furthermore, in the case where the adhesive resin layer is formed on both sides of the die bonding portion, the resin constituting respective layers may be the same or different.

As the thermosetting resin and photosetting resin, there can be mentioned a thermosetting polyimide resin, an epoxy resin, a polyester resin, a silicone resin, a polybutadiene resin, a diallyl phthalate resin, and an acryl resin. As the thermoplastic resins, there can be mentioned a thermoplastic polyimide resin, a polyamide resin, a polyamideimide resin, a polyether imide resin, an ABS resin, and a phenoxy resin.

Particularly in the first resin-encapsulated semiconductor device of the present invention, as the adhesive resins, a thermosetting or thermoplastic polyimide resin is preferable from the viewpoint that an adhesiveness thereof with a generally used die bonding agent and the encapsulating resin layer is highest among the above-mentioned resins.

As the thermosetting polyimide resin, there can be mentioned a resin composition in which a curing agent, a curing catalyst and the like are incorporated into a maleimide resin synthesizable from a maleic acid and a diamine, and a polyimide resin having a carbon-carbon triple bond at the end.

As concrete examples of the maleimide resin, there can be mentioned N,N'-phenylenebismaleimide, N,N'-hexamethylenebismaleimide, N,N'-diphenylmethane-bismaleimide, N,N'-oxy-di-p-phenylenebismaleimide, N,N'-4,4'-benzophenonebismaleimide, N,N'-p-diphenylsulfonebismaleimide, N,N'-(3,3'-dimethyl)methylene-di-phenylenebismaleimide, poly(phenylenemethylene) polymaleimide, 2,2-bis(4-phenoxyphenyl)propane-N,N'bismaleimide, bis(4-phenoxyphenyl)sulfone-N,N'bismaleimide, 1,4-bis(4-phenoxy)benzene-N,N'-bismaleimide, 1,3-bis(4-phenoxy)benzene-N,N'-bismaleimide, 1,3-bis(3-phenoxy)benzene-N,N'-bismaleimide.

As the curing agent for the maleimide resin, there can be preferably used amine compounds. As the specific examples of the amine compounds, there can be mentioned diamines such as 4,4'-diaminodiphenylmethane, 4,4'-diaminodiphenyl oxide, 4,4'-diaminodiphenylsulfone, 4,4'-diaminodicyclohexylmethane, 4,4'diaminocyclohexane, 2,6-diaminopyridine, m-phenylenediamine, p-phenylene-diamine, 2,2'-bis(4-aminophenyl)propane, bis(4-aminophenyl)methylphosphine oxide, bis(4-aminophenyl)methylamine, 1,5-diaminonaphthalene, m-xylylenediamine, bis(4-aminophenyl)phenylmethane, 1,1-bis(4-aminophenyl) cyclohexane, 1,1-bis(4-aminophenyl-3-methylphenyl) cyclohexane, 4,4-diaminodiphenyl ethel, N,N'-bis(4-aminobenzyl)-p-phenylenediamine, 4,4'-methylenebis(2-chloroaniline), 2,2-bis[4-(4-aminophenoxy)phenyl]propane, 2,2-bis[4-(4-aminophenoxy)phenyl]sulfone, 1,4-bis(4-aminophenoxy)benzene, 1,3-bis(4-aminophenoxy)benzene, and 1-3-bis(3-aminophenoxy)benzene, and other polyamines. These amine compounds can be used singly or in combination of two or more of them.

As the curing accelerator for the maleimide resin, there can be used any compounds which accelerate the reaction between the maleimide group and the curing agent. For example, there can be mentioned peroxides, phosphines, imidazoles, and diazabicyclo alkanes.

Furthermore, the thermoplastic polyimide resin can be generally synthesized by a polycondensation reaction between tetracarboxylic dianhydride and diamines. As examples of the tetracarboxylic dianhydride, pyromellitic dianhydride, benzophenone tetracarboxylic dianhydride, 2,3,6,7-naphthalene tetracarboxylic dianhydride, and 3,3,4,4-diphenyl tetracarboxylic dianhydride. These are used singly or in combination of two or more of them. On the other hand, as diamines, there can be mentioned m-phenylenediamine, p-phenylenediamine, 4,4-diaminodiphenyl-methane, 4,4-diaminodiphenylpropane, 4,4-diaminodiphenyl ethel and 4,4-diaminodiphenylsulfide, and siloxane-containing diamines such as diaminopropyl tetramethyl-disiloxane. These diamines can be used singly or in combination of two or more of them.

In the first resin-encapsulated semiconductor device of the present invention, the adhesive resin layers may be formed on the upper and side faces of the semiconductor chip, the side and lower faces of the die pad, the side face of the die bonding portion, and the surface of the bonding wire and the lead, thereby improving the adhesiveness between these members and the encapsulating resin layer to reduce the occurrence of expansion and cracks in the interfaces between the encapsulating resin layer and these members.

In the first resin-encapsulated semiconductor device of the present invention, by providing the adhesive resin layer described above between the semiconductor chip and the die bonding portion, it favorably becomes possible to form the die pad in optional shapes, e.g., having a hole. Furthermore, it is more preferable to provide the above adhesive resin layer between the die pad and the die bonding portion as well as between the die bonding portion and the semiconductor chip.

Other members constituting the first resin-encapsulated semiconductor device of the present invention will be described in detail.

As the resin material used in the encapsulating resin layer, any material which can be generally applied to the encapsulating resins can be used without any particular limitation. As specific examples, there can be mentioned thermosetting resins such as epoxy resins, polyester resins, silicone resins, polybutadien resins, diallylphthalate resins, maleimide resins and acryl resins, and thermoplastic resins such as PPS resins.

In the first resin-encapsulated semiconductor device of the present invention, of the resin materials described above, epoxy resins and maleimide resins are preferably used. These resins are combined respectively with various kinds of additives such as a curing agent, a curing promoter, a filler, a flame retardant, a pigment and a coupling agent, and can be used in the form of powdery resin compositions or liquid resin compositions.

As examples of the epoxy resins, there can be mentioned an epoxy-novolak resin, a bisphenol epoxy resin, a multifunctional epoxy resin and modified resins thereof. These resins can be used singly or in combination of two or more of them. As examples of curing agents of epoxy resins, there can be mentioned phenol resins such as phenol novolak and cresol novolak, and dicyandiamide. As the curing promoter of epoxy resins, there can be used any compounds which can promote the reaction between the epoxy group and the curing agent. For example, there can be mentioned phosphines, imidazoles and diazacycloalkanes.

As specific examples of the maleimide resins, there can be mentioned N,N'-phenylenebismaleimide, N,N'-hexamethylenebismaleimide, N,N'-diphenylmethanebismaleimide, N,N'-oxy-di-p-phenylenebismaleimide, N,N'-4,4'-benzophenonebismaleimide, N,N'-p-diphenylsulfone-bismaleimide, N,N'-(3,3'-dimethyl)methylene-di-p-phenylenebismaleimide, poly(phenylenemethylene)polymaleimide, 2,2-bis(4-phenoxyphenyl)propane-N,N'-bismaleimide, bis(4-phenoxyphenyl)sulfone-N,N'-bismaleimide, 1,4-bis(4-phenoxy)benzene-N,N'-bismaleimide, 1,3-bis(4-phenoxy)benzene-N,N'-bismaleimide, 1,3-bis(3-phenyoxy)benzene-N,N'-bismaleimide.

For the curing agent of maleimide resins, amine compounds can be preferably used. As examples of amine compounds, there can be mentioned diamines such as 4,4'-diaminodiphenylmethane, 4,4'-diaminodiphenyl oxide, 4,4'-diaminodiphenylsulfone, 4,4'-diaminodicyclohexylmethane, 4,4'-diaminocyclohexane, 2,6-diaminopyridine, m-phenylenediamine, p-phenylenediamine, 2,2'-bis(4-aminophenyl)propane, bis(4-aminophenyl)methylphosphine oxide, bis(4-aminophenyl)methylamine, 1,5-diaminonaphthalene, m-xylylenediamine, bis(4-aminophenyl) phenylmethane, 1,1-bis(4-aminophenyl) cyclohexane, 1,1-bis(4-aminophenyl-3-methylphenyl) cyclohexane, 4,4-diaminodiphenyl ethel, N,N'-bis(4-aminobenzyl)-p-phenylenediamine, 4,4'-methylenebis(2-chloroaniline), 2,2-bis[4-(4-aminophenoxy)phenyl]propane, 2,2-bis[4-(4-aminophenoxy)phenyl]sulfone, 1,4-bis(4-aminophenoxy) benzene, 1,3-bis(4-aminophenoxy)benzene, and 1,3-bis(3-aminophenoxy)benzene, and other polyamines. These amine compounds can be used singly or in combination of two or more of them.

As the curing accelerator for the maleimide resin, there can be used any compounds which accelerate the reaction between the maleimide group and the curing agent. For example, there can be mentioned peroxides, phosphines, imidazoles, and diazabicycloalkanes.

These epoxy resins and maleimide resins may be used in proper combination with each other or with different kinds of materials such as phenolic resins.

Furthermore, in the encapsulating resin layer, as the filler usable in combination with the encapsulating resin described above, there can be mentioned powdery materials such as silica, alumina, quartz, silicon carbide, silicon nitride and aluminum nitride.

Furthermore, various kinds of low-stress modifiers may be incorporated into the resin compositions in order to decrease the stress against the semiconductor chip.

The resin compositions can be readily prepared by combining the resin component (principal component) and various additive components in a predetermined ratio and by mixing them with a roll, a kneader, a blender, or by mixing by means of an extruder or a special blender which can perform a fine purverization, or by mixing in combination of each of these methods.

For materials applied for the die bonding portion, i.e., a die bonding agent, there can be applied materials conventionally used, such as resin pastes formed by incorporating a curing agent, a reactive diluent, a solvent and an electroconductivity-imparting agent into an epoxy resin and a polyimide resin, and thermosetting resins and thermoplastic resins described above which can be used as an encapsulating resin. These resins are combined with various additives described above as in the case where they are used as an encapsulating resin, and used in the form of a resin composition. In this case, a reactive diluent, an electroconductivity-imparting agent and a solvent may be blended.

Particularly in the first resin-encapsulated semiconductor of the present invention, the above-mentioned epoxy resins and maleimide resins are preferable from the viewpoint of heat-resistance, moisture-resistance, adhesiveness and practical use. These resins are combined with various additives and used in the form of a resin composition as in the case where they are used as an encapsulating resin. In this case, a reactive diluent, an electroconductive filler and a solvent may be blended. Furthermore, the die bonding agent used for the second resin-encapsulated semiconductor device of the present invention described below can be preferably used.

The die bonding agent comprising these resin materials are prepared in the form of a sheet, a powdery form or a liquid form. For example, by a preparation method similar to that for the resin composition used as an encapsulating resin described above, or by a method in which the resin composition and a solvent in such an amount that does not change the property of the resin composition are stirred and mixed in a simple mixing device, liquid die bonding agent can be obtained. Furthermore, a die bonding agent in the form of a sheet can be obtained by a method of pressing a resin composition or by a method in which a resin composition is dissolved in a suitable solvent and then spread in the form of a sheet and the solvent is removed to obtain a sheet.

Other than above-mentioned members, with regard to the die pad, the semiconductor chip, the bonding wire and the lead, suitable materials can be used according to the function of the semiconductor device.

The first resin-encapsulated semiconductor device of the present invention can be produced according to the following process.

The semiconductor chip is mounted on the die pad comprising an island and the like of the lead frame by the die bonding agent. Before this process, an adhesive resin layer is formed on the upper face of the die pad and/or the lower face of the semiconductor chip. Subsequently, the bonding pad portion on the upper face of the semiconductor chip is electrically connected by means of wire bonding with one end of the lead arranged in a periphery of the die pad, e.g., with an inner lead of the lead frame. Then, according to need, similar adhesive resin layer as described above may be formed on the exposed face of the semiconductor chip, die pad, bonding wire, inner lead and the like.

Next, these members are resin-encapsulated in such a state that the other end of the lead, e.g., an outer lead of the lead frame and the end portion of the support bar which supports the die pad are guided to the outside. As the encapsulating method, there can be adopted a general low-pressure transfer molding, an injection molding, a compression molding, a cast molding and the like. Furthermore, after being encapsulated, the encapsulating resin may be after-cured according to need.

The second resin-encapsulated semiconductor device of the present invention will be described in detail below.

The second resin-encapsulated semiconductor device of the present invention is characterized in that a material having a thermal expansion coefficient approximate to that of the encapsulating resin layer as described above is used as a die bonding agent. Concretely speaking, it differs depending on the encapsulating resin to be used, but in general, it is preferred that the thermal expansion coefficient of the die bonding agent be $0.5 \times 10^{-5}$–$2.2 \times 10^{-5}$/°C. while $1.0 \times 10^{-5}$–$1.5 \times 10^{-5}$/°C. of the thermal expansion coefficient of the encapsulating resin.

In the case where such a die bonding agent is used, the whole faces of the semiconductor chip are covered with a material having similar thermal expansion characteristics and being substantially of uniform. Accordingly, when said semiconductor device is left in a high temperature condition at the surface mounting, the thermal stress is evenly imposed on the semiconductor chip, and the thermal stress is hardly caused in the interface between the die bonding agent and the encapsulating resin layer. Thus, pealing in the interface between the semiconductor chip and the die bonding agent can be suppressed, and the occurrence of expansion and cracks due to the vaporization of the absorbed water can be prevented in the encapsulating resin layer.

The die bonding agent used in the second resin-encapsulated semiconductor device may be any material having the thermal expansion coefficient approximate to that of the encapsulating resin, as described above, without any limitation, but in practical use, there can be mentioned thermosetting resins and the like illustrated as an encapsulating resin. These resins are mixed with various additives described above as in the case used as an encapsulating resin, and used in the form of a resin composition. In this case, a reactive diluent, an electroconductivity-imparting agent and a solvent may also be added.

The die bonding agent is prepared in the form of a sheet, a powdery form or a liquid form. For example, by a preparation method for the encapsulating resin composition described above, or by a method in which the thermosetting resin composition and a solvent in such an amount that does not change the property of the resin composition are stirred and mixed in a simple mixing device, a liquid die bonding agent can be obtained. Furthermore, a die bonding agent in the form of a sheet can be obtained by a method of pressing a thermosetting resin composition or by a method in which a thermosetting resin composition is dissolved in a suitable solvent and then spread in the form of a sheet and the solvent is removed to obtain a sheet.

Incidentally, in the second resin-encapsulated semiconductor device of the present invention, with regard to the characteristics other than the thermal expansion coefficient, it is preferred that the die bonding agent be in the range approximate to the encapsulating resin. For example, it is preferred that the thermal stress be in the range of about 1.5 to 5.0 $Kg/mm^2$ (the thermal stress of general encapsulating resins: 2.5 to 4.0 $Kg/mm^2$), and the glass transition point (Tg) be in the range of about 100° to 220° C. (Tg of general encapsulating resins: 150° to 220° C.). The thermal stress is calculated by the following equation: (thermal stress)=(thermal expansion coefficient)×(elastic modulus)×Tg.

In the second resin-encapsulated semiconductor device of the present invention, it is preferred that very thin adhesive resin layer be formed in at least either the upper face, the lower face and the side faces of the semiconductor chip and the die pad respectively, in order to increase the adhesiveness in the interface between the semiconductor chip and the encapsulating resin layer and thereby decrease the occurrence of cracks in the encapsulating resin layer at the surface mounting. Particularly, in the same way as the above-mentioned first resin-encapsulated semiconductor device, it is preferred that the adhesive resin layer be formed in at least either interface between the die pad and the die bonding portion, or between the die bonding portion and the semiconductor chip.

The adhesive resin used in this adhesive resin layer is not particularly critical, and there can be preferably used the resins mentioned in the description of the first resin-encapsulated semiconductor device. In the second resin-encapsulated semiconductor device, however, it is required that the adhesive resin layer is particularly excellent in an adhesiveness with the encapsulating resin, and has characteristics such as the thermal expansion coefficient approximate with the encapsulating resin, i.e., has an approximate characteristics with the die bonding agent. Accordingly, concretely speaking, polyimide resin is most preferable as the adhesive resin. As the polyimide resin, it is preferred that the resin be synthesized by the polycondensation reaction between the tetracarboxylic dianhydride and diamine. As examples of the tetracarboxylic dianhydride, pyromellitic dianhydride, benzophenone tetracarboxylic dianhydride, 2,3,6,7-naphthalene tetracarboxylic dianhydride, and 3,3, 4,4-diphenyl tetracarboxylic dianhydride. These are used singly or in combination of two or more of them. On the other hand, as diamines, there can be mentioned m-phenylenediamine, p-phenylenediamine, 4,4-diaminodiphenyl-methane, 4,4-diaminodiphenylpropane, 4,4-diaminodiphenyl ethel and 4,4-diaminodiphenylsulfide, and siloxane-containing diamines such as diaminopropyl tetramethyl-disiloxane. These diamines can be used singly or in combination of two or more of them.

As other members constituting the second resin-encapsulated semiconductor device of the present invention, e.g., resin materials used for the encapsulating resin layer, there can be used similar materials as the first resin-encapsulated semiconductor device described above, and the same preparation method and application method can be used. Furthermore, other than above-mentioned members, with regard to the die pad, the semiconductor chip, the bonding wire and the lead, suitable materials can be used according to the function of the semiconductor device, in the same way as the above-mentioned first resin-encapsulated semiconductor device.

The second resin-encapsulated semiconductor device of the present invention can be produced according to the following process.

The semiconductor chip is mounted on the die pad comprised of an island and the like of the lead frame via the die bonding agent. Before this process, an adhesive resin layer may be formed, according to need, on the lower face of the semiconductor chip and the upper face of the die pad. Subsequently, the bonding pad portion on the upper face of the semiconductor chip is electrically connected by means of wire bonding with one end of the lead arranged in a periphery of the die pad, e.g., with an inner lead of the lead frame. Then, according to need, an adhesive resin layer may be formed on the exposed face of the semiconductor chip, die pad, bonding wire, inner lead and the like.

Next, these members are resin-encapsulated in such a state that the other end of the lead, e.g., an outer lead of the lead frame is guided to the outside by using the encapsulating resin. As the encapsulating method, there can be adopted a general low-pressure transfer molding, an injection molding, a compression molding, a cast molding and the like. Furthermore, after being encapsulated, the encapsulating resin may be after-cured according to need.

The examples of the present invention will now be described in detail with reference to the accompanying drawings. Incidentally, these examples are for easy understanding of the present invention, and by no means limit the scope of the present invention.

FIG. 1 shows a sectional structure of the semiconductor device illustrating one embodiment of the first resin-encapsulated semiconductor device of the present invention.

In FIG. 1, a die pad 11 is supported by a support bar (not shown). On this die pad 11, a semiconductor chip 13 is mounted via a die bonding portion 12. Here, between the upper face of the die pad 11 and the lower face of the die bonding portion 12, and between the upper face of the die bonding portion 12 and the lower face of the semiconductor chip 13, an adhesive resin layer 14 and 15 are interposed respectively.

On the upper face of the semiconductor chip 13, plural bonding pad portions 16 for leading electrodes outside are provided. In the periphery of the die pad 11, plural leads 17 which constitute a part of the lead frame are provided, and one end of the leads 17, i.e., inner leads 18 and the bonding pad portions 16 are electrically connected (wire bonding) via bonding wires 20. These members are encapsulated by a encapsulating resin layer 21 so that the other ends of the leads 17, i.e., outer leads 19 and the end portion of the support bar are guided to the outside.

In a device having such a structure, due to adhesive resin layers 14 and 15, the adhesiveness under high temperature and high humidity conditions can be improved between the upper face of the die pad 11 and the lower face of the die bonding portion 12, and between the upper face of the die bonding portion 12 and the lower face of the semiconductor chip 13. Particularly by means of the adhesive resin layer 14, water which intrudes into the upper face of the die pad through the interface of the support bar and the encapsulating resin layer 21 is blocked, and the deterioration of the adhesiveness in this part can be suppressed. Therefore, even if this device is left in high temperature and high humidity conditions at the surface mounting, pealing due to poor bonding is not caused in the interface in the periphery of the die bonding portion 12, especially in the interface between the die pad 11 and the die bonding portion 12, and the occurrence of expansion and cracks can be prevented.

Incidentally, in this example, the adhesive resin layers 14 and 15 are formed laminatedly on the whole upper face of the die pad 11 and on the whole lower face of the chip 13 respectively as shown in FIG. 1, but these resin layers can function well even if being formed locally in the partial area on each face.

The preparation examples of the resin-encapsulated semiconductor device according to the above-mentioned example will be described in detail below.

Incidentally, in the following preparation examples, encapsulating resins A to C prepared according to the formulations shown in Table 1 described below, liquid die bonding agents D to F prepared according to the formulations shown in Table 2 described below, and die bonding agents A# in the form of a sheet obtained by making a sheet of the encapsulating resin A are used respectively. With regard to the encapsulating resin, the adhesive strength under shear with a standard semiconductor chip and 42 alloy lead frame is also shown in Table 1.

Preparation Example 1

Diaminodiphenyl ethel and pyromellitic dianhydride were reacted with each other to synthesize a polyimide resin. N-methyl-2-pyrrolidone solution (concentration of 20% by weight) of this polyimide resin was applied in thickness of 1 um respectively on the upper face of the die pad composed of the island of the lead frame and on the lower face of the semiconductor chip having plural bonding pad portions on the upper face thereof to form an adhesive resin layer.

Subsequently, the semiconductor chip was mounted on the die pad via the die bonding portion comprising the die bonding agent D. Afterwards, the bonding pad portion of the semiconductor chip and the inner lead of the lead frame arranged in the periphery of the die pad were bonded by a gold wire. Then, these members were encapsulated by a encapsulating resin A. The encapsulation was carried out by using a general transfer molding machine at a temperature of 175° C. for 2 minutes. Furthermore, they were subjected to after curing at a temperature of 175° C. for 8 hours to obtain a sample of the resin-encapsulated semiconductor device having a structure shown in FIG. 1 (QFP-184 pin).

20 pcs. of this sample were left to stand still for 2 minutes in a VPS device at a temperature of 215° C. after being treated under a condition of a temperature of 85° C. and humidity of 85% and moisture-absorbing until the water content in the encapsulating resin layer became saturated. These samples were observed to check the occurrence of cracks in the encapsulating resin layer. Furthermore, the samples after the VPS treatment were treated for a predetermined time (PCT) in a pressure cooker at a temperature of about 121° C. and 2 atmospheres, and then the number of samples failed in operation were checked. The results are shown in Table 3 described below.

Preparation Example 2

A sample of the semiconductor device having a structure shown in FIG. 1 (QFP-184 pin) was prepared by the same procedure as in Preparation Example 1 except that the thickness of the adhesive resin layer comprising said polyimide resin was 10 um, and was subjected to the same performance evaluation. The results are shown in Table 3.

Preparation Example 3

A sample of the semiconductor device having a structure shown in FIG. 1 (QFP-184 pin) was prepared by the same procedure as in Preparation Example 1 except that the thickness of the adhesive resin layer comprising said polyimide resin was 20 um, and was subjected to the same performance evaluation. The results are shown in Table 3.

Figure 2:
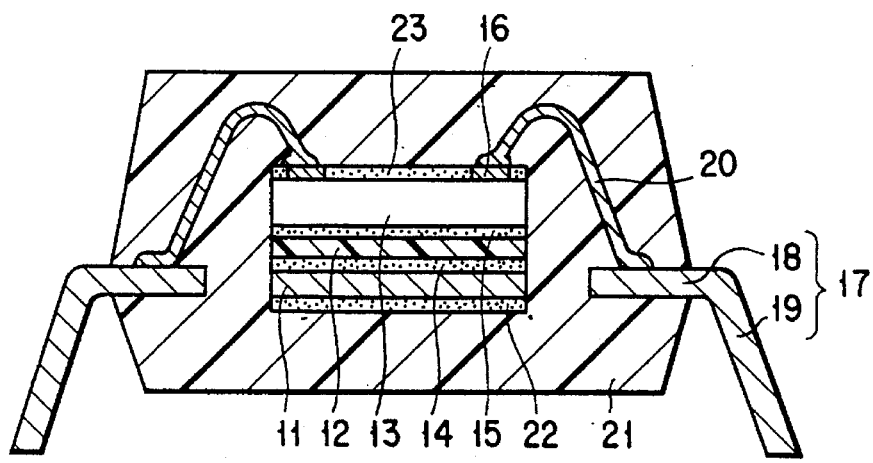
FIG. 2 is a sectional view illustrating the structure of another embodiment of the first resin-encapsulated semiconductor device of the present invention which has adhesive resin layers respectively in the interfaces of the die bonding portion and the die pad, and the die bonding portion and the semiconductor chip, and between the lower face of the die pad and the encapsulating resin layer, and between the upper face of the semiconductor chip and the encapsulating resin layer.

FIG. 2 shows a sectional structure of the semiconductor device illustrating another embodiment of the first resin-encapsulated semiconductor device in the present invention. The resin-encapsulated semiconductor device illustrated herein has basically a similar structure with the one shown in FIG. 1, and the identical member with FIG. 1 is shown by the same reference numeral.

In the resin-encapsulated semiconductor device shown in FIG. 2, the similar adhesive resin layers 22 and 23 are provided other than the interfaces of the upper face and the lower face of the die bonding portion 12. That is, an adhesive resin layer 22 is interposed between the lower face of the die pad 11 and the encapsulating resin layer 21 and an adhesive resin layer 23 is interposed between the upper face of the semiconductor chip 13 and the encapsulating resin layer 21. In this case, the adhesiveness in the interfaces between the die pad 11 and the encapsulating resin layer 21, and between the semiconductor chip 13 and the encapsulating resin layer 21 is improved and pealing is prevented. Accordingly, the occurrence of expansion and cracks in the encapsulating resin layer 21 can be further reduced.

The preparation example of the semiconductor device according to the above example will be described below.

Preparation Example 4

Diaminodiphenyl ethel and pyromellitic dianhydride were reacted with each other to synthesize a polyimide resin. N-methyl-2-pyrrolidone solution (concentration of 20% by weight) of this polyimide resin was applied in thickness of 10 um respectively on the upper and the lower faces of the semiconductor chip and the upper and lower faces of the die pad (island) of the lead frame to form an adhesive resin layer.

By using thus treated semiconductor chip, the lead frame, encapsulating resin B and die bonding agent D, a sample of the semiconductor device having a structure shown in FIG. 2 (QFP-184 pin) was prepared in the same manner as described in Preparation Example 1, and subjected to the same performance evaluation. The results are shown in Table 3.

Preparation Example 5

A sample of the semiconductor device having a structure shown in FIG. 2 (QFP-184 pin) was prepared by the same procedure as in Preparation Example 4 except that encapsulating resin C and die bonding agent E were used and was subjected to the same performance evaluation. The results are shown in Table 3.

Preparation Example 6

A sample of the semiconductor device having a structure shown in FIG. 2 (QFP-184 pin) was prepared by the same procedure as in Preparation Example 4 except that encapsulating resin C and die bonding agent F were used and was subjected to the same performance evaluation. The results are shown in Table 3.

Preparation Example 7

A sample of the semiconductor device having a structure shown in FIG. 2 (QFP-184 pin) was prepared by the same procedure as in Preparation Example 4 except that encapsulating resin A and die bonding agent A# which was obtained by processing the encapsulating resin A in the form of a sheet having a size of 15×15×0.03 mm$^\square$ was used and was subjected to the same performance evaluation. The results are shown in Table 3.

Figure 3:
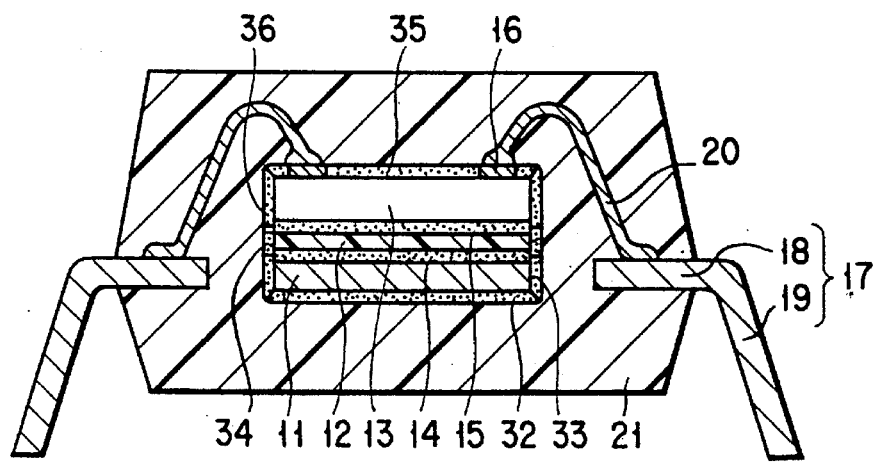
FIG. 3 is a sectional view illustrating the structure of still another embodiment of the first resin-encapsulated semiconductor device of the present invention which has adhesive resin layers respectively in the interfaces of the die bonding portion and the die pad, and the die bonding portion and the semiconductor chip, and between the side face of the die bonding portion and the encapsulating resin layer, between the lower face and the side face of the die pad and the encapsulating resin layer, and between the upper face and the side face of the semiconductor chip and the encapsulating resin layer.

FIG. 3 shows a sectional structure of the semiconductor device illustrating further embodiment of the first resin-encapsulated semiconductor device in the present invention. The resin-encapsulated semiconductor device illustrated herein has basically a similar structure with the one shown in FIG. 1, and the identical member with FIG. 1 is shown by the same reference numeral.

In the resin-encapsulated semiconductor device shown in FIG. 3, the similar adhesive resin layers 32, 33, 34 and 35 are provided other than the interfaces of the upper face and the lower face of the die bonding portion 12. That is, adhesive resin layers 32 and 33 are interposed between the lower face and the side face of the die pad 11 and the encapsulating resin layer 21, an adhesive resin layer 34 is interposed between the side face of the die bonding portion 12 and the encapsulating resin layer 21, and adhesive resin layers 35 and 36 are interposed between the upper face and the side faces of the semiconductor chip 13 and the encapsulating resin layer 21. In this case, the adhesiveness in all interfaces between the die pad 11 and the encapsulating resin layer 21, and between the semiconductor chip 13 and the encapsulating resin layer 21 is improved and pealing is prevented. Accordingly, the occurrence of expansion and cracks in the sealing resin layer 21 can be further reduced.

The preparation example of the semiconductor device according to the above example will be described below.

Preparation Example 8

Diaminodiphenyl ethel and pyromellitic dianhydride were reacted with each other to synthesize a polyimide resin. N-methyl-2-pyrrolidone solution (concentration of 20% by weight) of this polyimide resin was applied in thickness of 10 um respectively on the lower face of the semiconductor chip having plural bonding pad portions on the upper face thereof and on the upper face of the die pad composed of the island of the lead frame to form an adhesive resin layer.

Subsequently, the semiconductor chip was mounted on the die pad with the die bonding portion composed of die bonding agent D interposed. Then, the bonding pad portion of the semiconductor chip and the inner lead of the lead frame arranged in the periphery of the die pad were bonded by a gold wire. Afterwards, the polyimide resin was sprayed to the upper and side faces of the semiconductor chip, the side and lower faces of the die pad and the side face of the die bonding portion to form an adhesive resin layer.

A sample of the semiconductor device having a structure shown in FIG. 3 (QFP-184 pin) was prepared by the same procedure as in Preparation Example 1 by using thus treated semiconductor chip, the lead frame and encapsulating resin B, and subjected to the same performance evaluation. The results are shown in Table 3.

Figure 4:
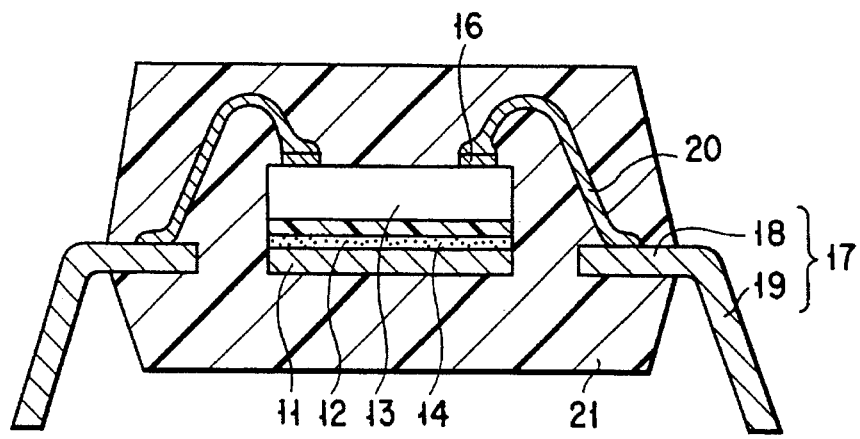
FIG. 4 is a sectional view illustrating the structure of still another embodiment of the first resin-encapsulated semiconductor device of the present invention which has an adhesive resin layer only in the interface of the die bonding portion and the die pad.

FIG. 4 shows a sectional structure of the semiconductor device illustrating still another embodiment of the first resin-encapsulated semiconductor device in the present invention. The resin-encapsulated semiconductor device illustrated herein has basically a similar structure with the one shown in FIG. 1, and the identical member with FIG. 1 is shown by the same reference numeral.

In the resin-encapsulated type semiconductor device shown in FIG. 4, an adhesive resin layer 14 is provided only between the upper face of the die pad 11 and the lower face of the die bonding portion 12. In this case, the adhesiveness in the interface between the die pad 11 and the die bonding portion 12 is improved and pealing is prevented. Accordingly, the occurrence of expansion and cracks in the encapsulating resin layer 21 can be reduced.

, The preparation example of the semiconductor device according to the above example will be described below.

Preparation Example 9

Diaminodiphenyl ethel and pyromellitic dianhydride were reacted with each other to synthesize a polyimide resin. N-methyl-2-pyrrolidone solution (concentration of 20% by weight) of this polyimide resin was applied in thickness of 10 um on the upper face of the die pad composed of the island of the lead frame to form an adhesive resin layer. A sample of the semiconductor device having a structure shown in FIG. 4 (QFP-184 pin) was prepared by the same procedure as in Preparation Example 1 by using thus treated lead frame, semiconductor chip, and also encapsulating resin A and die bonding agent D, and subjected to the same performance evaluation. The results are shown in Table 3.

Comparative Example 1

Diaminodiphenyl ethel and pyromellitic dianhydride were reacted with each other to synthesize a polyimide resin. N-methyl-2-pyrrolidone solution (concentration of 20% by weight) of this polyimide resin was applied in thickness of 10 um respectively only on the upper face of the semiconductor chip and on the lower face of the die pad composed of the island of the lead frame to form an adhesive resin layer. Subsequently, a sample of the semiconductor device (QFP-184 pin) was prepared by the same procedure as in Preparation Example 1 by using thus treated semiconductor chip, lead frame and encapsulating resin A and die bonding agent D, and subjected to the same performance evaluation. The results are shown in Table 3.

Comparative Example 2

Untreated semiconductor chip was mounted on the die pad composed of the island of the lead frame with the die bonding portion comprising die bonding agent D interposed. Then, the bonding pad portion of the semiconductor chip and the inner lead of the lead frame arranged in the periphery of the die pad were bonded by a gold wire. Afterwards, the polyimide resin used in Comparative Example 1 was sprayed to the upper and side face of the semiconductor chip, the side and the lower face of the die pad and the side face of the die bonding portion to form an adhesive resin layer.

A sample of the semiconductor device (QFP-184 pin) was prepared by the same procedure as in Preparation Example 1 by using thus treated semiconductor chip, lead frame and encapsulating resin A, and subjected to the same performance evaluation. The results are shown in Table 3.

Figure 5:
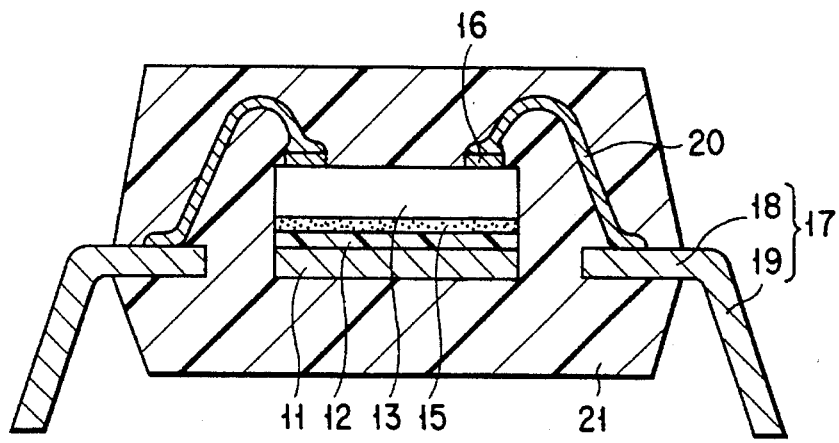
FIG. 5 is a sectional view illustrating the structure of still another embodiment of the first resin-encapsulated semiconductor device of the present invention which has an adhesive resin layer only in the interface of the die bonding portion and the semiconductor chip.

FIG. 5 shows a sectional structure of the semiconductor device illustrating other embodiment of the first resin-encapsulated semiconductor device in the present invention. The resin-encapsulated semiconductor device illustrated herein has basically a similar structure with the one shown in FIG. 1, and the identical member with FIG. 1 is shown by the same reference numeral.

In the resin-encapsulated semiconductor device shown in FIG. 5, an adhesive resin layer 15 is provided only between the lower face of the semiconductor chip and the upper face of the die bonding portion 12. In this case, the adhesiveness in the interface between the semiconductor chip 13 and the die bonding portion 12 is improved and pealing is prevented. Accordingly, the occurrence of expansion and cracks in the sealing resin layer 21 can be reduced.

The preparation example of the semiconductor device according to the above example will be described below.

Preparation Example 10

A sample of the semiconductor device (QFP-184 pin) having a structure shown in FIG. 5 was prepared by the same procedure as in Preparation Example 1 except that an adhesive polyimide resin layer was not formed on the upper face of the die pad, but the adhesive polyimide resin layer having a thickness of about 10 um was formed only on the lower face of the semiconductor chip, and was subjected to the same performance evaluation as in Preparation Example 1. The results are shown in Table 4.

Figure 6:
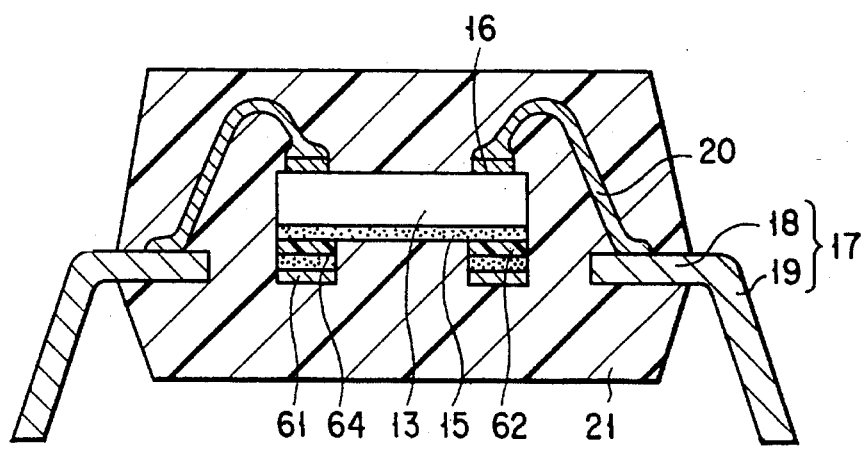
FIG. 6 is a sectional view illustrating the structure of still another embodiment of the first resin-encapsulated semiconductor device of the present invention which has adhesive resin layers respectively in the interfaces of the die bonding portion and the die pad, and the die bonding portion and the semiconductor chip, and the die pad having a hole.

FIG. 6 shows a sectional structure of the semiconductor device illustrating other embodiment of the first resin-encapsulated semiconductor device in the present invention. The resin-encapsulated semiconductor device illustrated herein has basically a similar structure with the one shown in FIG. 1, and the identical member with FIG. 1 is shown by the same reference numeral.

In the resin-encapsulated semiconductor device shown in FIG. 6, die pad 61 having a hole in the central portion is used, and an adhesive resin layer 64 is provided between the upper face of the die pad 61 and the lower face of the die bonding portion 62, and an adhesive resin layer 15 is provided between the lower face of the semiconductor chip 13 and the upper face of the die bonding portion 62, respectively. In this case, the adhesiveness in the interfaces between the die bonding portion 62 and the semiconductor chip 13 and between the die bonding portion 62 and the die pad 61 is improved and pealing is prevented. Accordingly, the occurrence of expansion and cracks in the encapsulating resin layer 21 can be reduced.

The preparation example of the semiconductor device according to the above example will be described.

Preparation Example 11

A sample of the semiconductor device (QFP-184 pin) having a structure shown in FIG. 6 was prepared by the same procedure as in Preparation Example 1 except that a die pad with a hole having a diameter of 10 mm in the central portion was used so that the encapsulating resin was contacted with a part of the lower face of the semiconductor chip with only the adhesive resin layer interposed, and was subjected to the same performance evaluation as in Preparation Example 1. The results are shown in Table 4.

Figure 7:
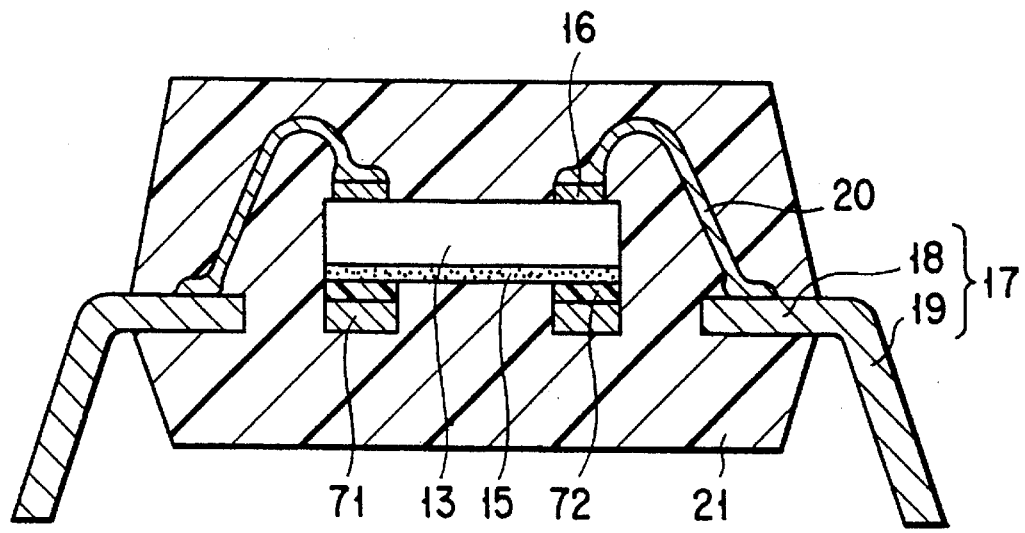
FIG. 7 is a sectional view illustrating the structure of still another embodiment of the first resin-encapsulated semiconductor device of the present invention which has an adhesive resin layer in the interface of the die bonding portion and the semiconductor chip, and the die pad having a hole.

FIG. 7 shows a sectional structure of the semiconductor device illustrating other embodiment of the first resin-encapsulated semiconductor device in the present invention. The resin-encapsulated semiconductor device illustrated herein has basically a similar structure to the one shown in FIG. 1, and the identical member with FIG. 1 is shown by the same reference numeral.

In the resin-encapsulated semiconductor device shown in FIG. 7, die pad 71 having a hole in the central portion is used, and an adhesive resin layer 15 is provided only between the upper face of the die bonding portion 72 and the lower face of the semiconductor chip 13. In this case, the adhesiveness in the interfaces between the die bonding portion 72 and the semiconductor chip 13 is improved and pealing is prevented. Accordingly, the occurrence of expansion and cracks in the encapsulating resin layer 21 can be reduced.

The preparation example of the semiconductor device according to the above example will be described below.

Preparation Example 12

A sample of the semiconductor device (QFP-184 pin) having a structure shown in FIG. 7 was prepared by the same procedure as in Preparation Example 1 except that a die pad with a hole having a rectangular shape of 10×10 mm in the central portion was used so that the encapsulating resin was contacted with a part of the lower face of the semiconductor chip with only the adhesive resin layer interposed, and an adhesive a polyimide resin layer was formed only on the lower face of the semiconductor chip and not on the upper face of the die pad, and was subjected to the same performance evaluation as in Preparation Example 1. The results are shown in Table 4.

Comparative Examples 3 and 4

A sample of the semiconductor device (QFP-184 pin) was prepared by the same procedure as in Preparation Examples 11 and 12 except that the adhesive polyimide resin layer was not altogether formed respectively, and was subjected to the same performance evaluation as in Preparation Example 1. The results are shown in Table 4.

Figure 8:
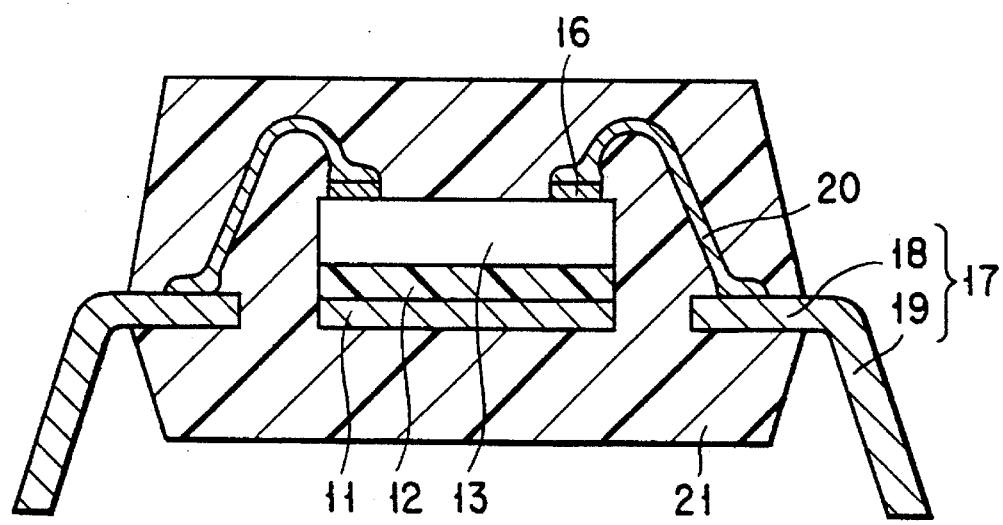
FIG. 8 is a sectional view showing the structure of one embodiment of the second resin-encapsulated semiconductor device of the present invention.

FIG. 8 shows a sectional structure of the semiconductor device illustrating one embodiment of the second resin-encapsulated semiconductor device in the present invention. The resin-encapsulated semiconductor device illustrated herein has basically a similar structure to the one shown in FIG. 1, and the identical member with FIG. 1 is shown by the same reference numeral.

In the resin-encapsulated semiconductor device shown in FIG. 8, an adhesive resin layer is not altogether provided. Instead, a die bonding agent having a thermal expansion coefficient in the range of about ±50% of the thermal expansion coefficient of the encapsulating resin layer 21 is used for the die bonding portion 12 as described above.

Incidentally, the die bonding agent is preferred to be formed in the laminal state over the whole upper face of the die pad 11 as shown in FIG. 8, and can bond sufficiently the semiconductor chip 13 only by being formed locally in the partial area of the die pad 11.

The device having such a structure has almost identical characteristics against the heat in the whole area adjoining the semiconductor chip 13, i.e., the die bonding agent layer 12 and the encapsulating resin layer 21. Therefore, when this device is put in a high temperature condition, the thermal stress is added uniformly against the semiconductor chip 13, and the occurrence of expansion and cracks in the encapsulating resin layer 21 can be prevented. The preparation example of the semiconductor device according to the above example will be described below.

Preparation Example 13

An encapsulating resin G was prepared according to the formulation shown in Table 5 described below. And 100 parts by weight of this encapsulating resin G was dissolved into 20 parts by weight of methyl cellosolve, and this solution was formed into a sheet at a temperature of 80° C. and under reduced pressure to obtain a die bonding agent J.

Incidentally, the thermal expansion coefficient, the thermal stress, the glass transition temperature, and the adhesive strength under shear with a standard semiconductor chip and 42 alloy lead frame of the sealing resin G, or die bonding agent J, are also shown in Table 5.

Subsequently, by using the die bonding agent J, a semiconductor chip in which plural bonding pad portions were formed on the upper face thereof is mounted on the die pad composed of the island of the lead frame. Afterwards, the bonding pad portion of the semiconductor chip and the inner lead of the lead frame arranged in the periphery of the die pad were bonded by a gold wire. Then, these members were encapsulated with the encapsulating resin G by using a general transfer molding machine at a temperature of 175° C. for 2 minutes. Furthermore, they were subjected to aftercuring at a temperature of 175° C. for 8 hours to obtain a sample of the resin-encapsulated semiconductor device having a structure shown in FIG. 8 (QFP-184 pin).

20 pcs. of this sample were left to stand still for 2 minutes in a VPS device at a temperature of 215° C. after being treated under a condition of a temperature of 85° C. and humidity of 85%, and moisture-absorbing until the water content in the encapsulating resin layer became saturated. These samples were observed to check the occurrence of cracks in the encapsulating resin layer. Furthermore, the samples after the VPS treatment were treated for a predetermined time (PCT) in a pressure cooker of a temperature of about 121° C. and 2 atmospheres, and then the number of samples failed in operation were checked. The results are shown in Table 6 described below.

Preparation Example 14

Die bonding agent K was obtained by processing the encapsulating resin G into a form of a sheet by a compression. A sample of a semiconductor device having a structure shown in FIG. 8 (QFP-184 pin) was prepared by the same procedure as in Preparation Example 13 except for using the die bonding agent K, and was subjected to the same performance evaluation. Incidentally, the property of the die bonding agent K is identical with the die bonding agent J. The results are shown in Table 6.

Preparation Example 15

An encapsulating resin H was prepared according to the formulation shown in Table 5 described below. And 100 parts by weight of this encapsulating resin H was dissolved into 20 parts by weight of methyl cellosolve, and this solution was formed into a sheet at a temperature of 80° C. and under reduced pressure to obtain a die bonding agent M.

Incidentally, the thermal expansion coefficient, the thermal stress, the glass transition temperature, and the adhesive strength under shear with a standard semiconductor chip and 42 alloy lead frame of the encapsulating resin H, or die bonding agent M, are also shown in Table 5.

Then, a sample of a semiconductor device having a structure shown in FIG. 8 (QFP-184 pin) was prepared by the same procedure as described in Preparation Example 13 except for using the encapsulating resin H and the die bonding agent M, and was subjected to the same performance evaluation. The results are shown in Table 6.

Comparative Example 5

A sample of a semiconductor device having a structure shown in FIG. 8 (QFP-184 pin) was prepared by the same procedure as described in Preparation Example 13 except for using a commercially available solvent-soluble type epoxy resin (Die bonding agent CRM-1072 manufactured by Sumitomo Bakelite Co.) as a die bonding agent, and was subjected to the same performance evaluation. The results are shown in Table b 6.

Incidentally, this commercially available die bonding agent had the thermal expansion coefficient of $5.0 \times 10^{-5}$/°C., the thermal stress of 0.8 Kg/mm$^2$ and the glass transition point of 48° C.

Resin-encapsulated semiconductor devices each having the same structure as the semiconductor device shown in the one of FIGS. 1 to 3 except that a die bonding agent having a thermal expansion coefficient in the range of about ±50% of the thermal expansion coefficient of the encapsulating resin is used for the die bonding portion will be described below.

Preparation Example 16

Diaminodiphenyl ethel and pyromellitic dianhydride were reacted with each other to synthesize a polyimide resin. N-methyl-2-pyrrolidone solution (concentration of 20% by weight) of the polyimide resin was applied in thickness of 10 um respectively on the lower face of the semiconductor chip and on the upper face of the die pad composed of the island of the lead frame to form an adhesive resin layer.

By using thus treated semiconductor chip, lead frame, the encapsulating resin G and the die bonding agent J, a sample of the semiconductor device having a structure shown in FIG. 1 (QFP-184 pin) was prepared in the same manner as described in Preparation Example 13, and subjected to the same performance evaluation. The results are shown in Table 7.

Preparation Example 17

Die bonding agent L was obtained by processing a resin prepared in the same manner as the preparation of the encapsulating region G except for using silver powder AgC-GS (manufactured by Fukuda Kinzoku Co.) instead of silica powder, into a form of a sheet by a compression. A sample of the semiconductor device having a structure shown in FIG. 1 (QFP-184 pin) was prepared in the same manner as described in Preparation Example 16 except for using the die bonding agent L, and subjected to the same performance evaluation. Incidentally, the property of the die bonding agent L is identical with that of the die bonding agent J. The results are shown in Table 7.

Preparation Example 18

Diaminodiphenyl ethel and pyromellitic dianhydride were reacted with each other to synthesize a polyimide resin. N-methyl-2-pyrrolidone solution (concentration of 20% by weight) of this polyimide resin was applied in thickness of 10 um respectively on the upper and lower faces of the semiconductor chip and on the upper and lower faces of the die pad composed of the island of the lead frame to form an adhesive resin layer.

By using thus treated semiconductor chip, lead frame, the encapsulating resin G and the die bonding agent J, a sample of the semiconductor device having a structure shown in FIG. 2 (QFP-184 pin) was prepared in the same manner as described in Preparation Example 13, and subjected to the same performance evaluation. The results are shown in Table 7.

Preparation Example 19

An encapsulating resin I was prepared according to the formulation shown in Table 5 described below. This encapsulating resin I was processed into a form of a sheet by a compression to obtain a die bonding agent N.

Incidentally, the thermal expansion coefficient, the thermal stress, the glass transition temperature, and the adhesive strength under shear with a standard semiconductor chip and 42 alloy lead frame of the encapsulating resin I (die bonding agent N) are also shown in Table 5.

On the other hand, diaminodiphenyl ethel and pyromellitic dianhydride were reacted with each other to synthesize a polyimide resin. N-methyl-2-pyrrolidone solution (concentration of 20% by weight) of this polyimide resin was applied in thickness of 10 um respectively on the lower face of the semiconductor chip where plural bonding pad portions were formed on the upper face thereof and on the upper face of the die pad composed of the island of the lead frame to form an adhesive resin layer.

Subsequently, by using die bonding agent N, a semiconductor chip was mounted on the die pad in which said adhesive resin layer was formed. Then, the bonding pad portion of the semiconductor chip and the inner lead of the lead frame arranged in the periphery of the die pad were bonded by a gold wire. Afterwards, the polyimide resin was sprayed to the upper face and the side face of the semiconductor chip, the side and lower faces of the die pad and the side face of the die bonding agent layer to form an adhesive resin layer.

Then, a sample of a semiconductor device having a structure shown in FIG. 8 (QFP-184 pin) was prepared by encapsulating thus treated members with the encapsulating agent I in the same procedure as described in Preparation Example 13, and was subjected to the same performance evaluation. The results are shown in Table 7.

Preparation Example 20

After mixing each component according to a different formulation from the encapsulating resin G as shown in Table 8 described below, the mixture was processed into a sheet by a compression to obtain a die bonding agent O.

Incidentally, the thermal expansion coefficient, the thermal stress, the glass transition temperature, and the adhesive strength under shear with a standard semiconductor chip and 42 alloy lead frame of the die bonding agent O are also shown in Table 8. As shown in Table 8, in the die bonding agent O, the thermal expansion coefficient is different from that of the encapsulating resin G, but is in the range of ±50% of that of the encapsulating resin G.

Then, a sample of a semiconductor device having a structure shown in FIG. 3 (QFP-184 pin) was prepared by the same procedure as described in Preparation Example 19 except for using the encapsulating resin G and the die bonding agent O, and was subjected to the same performance evaluation. The results are shown in Table 9.

Preparation Example 21

After mixing each component according to a different formulation from the encapsulating resin G as shown in Table 8 described below, the mixture was processed into a sheet by a compression to obtain a die bonding agent P.

Incidentally, the thermal expansion coefficient, the thermal stress, the glass transition temperature, and the adhesive strength under shear with a standard semiconductor chip and 42 alloy lead frame of the die bonding agent P are also shown in Table 8. As shown in Table 8, in the die bonding agent P, the thermal expansion coefficient is different from that of the encapsulating resin G, but is in the range of ±50% of that of the encapsulating resin G.

Then, a sample of a semiconductor device having a structure shown in FIG. 3 (QFP-184 pin) was prepared by the same procedure as described in Preparation Example 19 except for using the encapsulating resin G and the die bonding agent P, and was subjected to the same performance evaluation. The results are shown in Table 9.

Preparation Example 22

After mixing each component according to a different formulation from the encapsulating resin G as shown in Table 8 described below, the mixture was processed into a sheet by a compression to obtain a die bonding agent Q.

Incidentally, the thermal expansion coefficient, the thermal stress, the glass transition temperature, and the adhesive strength under shear with a standard semiconductor chip and 42 alloy lead frame of the die bonding agent Q are also shown in Table 8. As shown in Table 8, in the die bonding agent Q, the thermal expansion coefficient is different from that of the encapsulating resin G, but is in the range of ±50% of that of the encapsulating resin G.

Then, a sample of a semiconductor device having a structure shown in FIG. 3 (QFP-184 pin) was prepared by the same procedure as described in Preparation Example 19 except for using the encapsulating resin G and the die bonding agent Q, and was subjected to the same performance evaluation. The results are shown in Table 9.

Preparation Example 23

After mixing each component according to a different formulation from the encapsulating resin G as shown in Table 8 described below, the mixture was processed into a sheet by a compression to obtain a die bonding agent R.

Incidentally, the thermal expansion coefficient, the thermal stress, the glass transition temperature, and the adhesive strength under shear with a standard semiconductor chip and 42 alloy lead frame of the die bonding agent R are also shown in Table 8. As shown in Table 8, in the die bonding agent R, the thermal expansion coefficient is different from that of the encapsulating resin G, but is in the range of ±50% of that of the encapsulating resin G.

Then, a sample of a semiconductor device having a structure shown in FIG. 3 (QFP-184 pin) was prepared by the same procedure as described in Preparation Example 19 except for using the encapsulating resin G and the die bonding agent R, and was subjected to the same performance evaluation. The results are shown in Table 9.

Comparative Example 6

After mixing each component according to a different formulation from the encapsulating resin G as shown in Table 8 described below, the mixture was processed into a sheet by a compression to obtain a die bonding agent S.

Incidentally, the thermal expansion coefficient, the thermal stress, the glass transition temperature, and the adhesive strength under shear with a standard semiconductor chip and 42 alloy lead frame of the die bonding agent S are also shown in Table 8. As shown in Table 8, in the die bonding agent S, the thermal expansion coefficient is different from that of the encapsulating resin G, and is out of the range of ±50% of that of the encapsulating resin G.

Then, a sample of a semiconductor device having a structure shown in FIG. 3 (QFP-184 pin) was prepared by the same procedure as described in Preparation Example 19 except for using the encapsulating resin G and the die bonding agent S, and was subjected to the same performance evaluation. The results are shown in Table 9.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

TABLE 1

<Formulation for the Encapsulating Resins>

|  |  | Encapsulating Resin | | |
| --- | --- | --- | --- | --- |
| Raw Material |  | A | B | C |
| <Epoxy Resin> |  |  |  |  |
| Biphenyl epoxy resin (YH-4000H manufactured by Yuka Shell Epoxy Co.) |  | 10.1 | — | 2.6 |
| Trifunctional epoxy resin (ESX-221 manufactured by Yuka Shell Epoxy Co.) |  | — | 10.3 | — |
| Brominated bisphenol A-type epoxy resin (AER-755T manufactured by Asahi Chemical Industry Co.) |  | 2.5 | 2.5 | 2.5 |
| <Maleimide Resin> |  |  |  |  |
| Diphenylmethane-N,N'-bismaleimide (Molecular weight 358) |  | — | — | 6.9 |
| <Curing Agent> |  |  |  |  |
| Phenolic novolak resin (BRG-556 manufactured by Showa High polymer Co.) |  | 6.0 | — | — |
| Trifunctional phenolic resin |  | — | 5.8 | — |

TABLE 1-continued

<Formulation for the Encapsulating Resins>

|  |  | Encapsulating Resin | | |
| --- | --- | --- | --- | --- |
| Raw Material |  | A | B | C |
| (YL-6065 manufactured by Yuka Shell Epoxy Co.) |  |  |  |  |
| 1,3-bis(4-amino phenoxy)benzene |  | — | — | 5.9 |
| <Curing Accelerator> |  |  |  |  |
| Dicumyl peroxide |  | — | — | 0.1 |
| Triphenyl phosphine |  | 0.2 | — | 0.1 |
| Imidazole |  | — | 0.3 | — |
| <Filler> | Fused silica powder | 80.5 | 80.5 | 79.2 |
| <Releasing Agent> | Carnauba wax | 0.4 | 0.4 | 0.4 |
| <Treating Agent> | Silane coupling agent (A-187) | 0.5 | 0.5 | 0.5 |
| <Pigment> | Carbon black | 0.3 | 0.3 | 0.3 |
| <Flame Retardent> | Antimony trioxide (unit, part by weight) | 2.0 | 2.0 | 2.0 |
| Adhesive Strength under shear (Room temperature) kg/mm² | *Semiconductor chip | 3 | 2 | 2 |
|  | *42 alloy lead Frame | 2 | 0.5 | 1 |

TABLE 2

<Formulation for Die Bonding Agents>

|  | Die Bonding Agent | | |
| --- | --- | --- | --- |
| Raw Material | D | E | F |
| <Epoxy Resin> |  |  |  |
| Cresol novolak-type epoxy resin (ESCN-195XL manufactured by Sumitomo Chemical Co.) | 20 | 15 | — |
| Bisphenol A-type epoxy resin (EP828 manufactured by Yuka Shell Epoxy Co.) | 20 | 5 | 6 |
| <Maleimide Resin> |  |  |  |
| Diphenylmethane-N,N'-bismaleimide (Molecular weight 358) | — | — | 13 |
| <Curing Agent> |  |  |  |
| Dicyanamide | 10 | — | — |
| Phenolic resin BRG-558 manufactured by Showa High polymer Co. | — | 10 | — |
| 1,3-bis(4-amino phenoxy)benzene | — | — | 11 |
| <Curing Accelerator> |  |  |  |
| Dicumyl peroxide | — | — | 0.2 |
| Imidazole | 0.5 | 0.3 | 0.2 |
| <Filler> |  |  |  |
| Fused silica powder (Average particle size 5 μm) | 50 | — | 10 |
| Silver powder (Ag-CS manufactured by Fukuda Kinzoku Hakufun Kogyo Co.) | — | 70 | 60 |
| <Solvent> |  |  |  |
| Methyl cellosolve | 50 | 50 | 50 |

TABLE 3

|  |  | Preparation Example |  |  |  |  |  |  |  |  | Comparative Example |  |
|---|---|---|---|---|---|---|---|---|---|---|---|---|
|  |  | 1 | 2 | 3 | 4 | 5 | 6 | 7 | 8 | 9 | 1 | 2 |
| Encapsulating Resin |  | A | A | A | B | C | C | A | B | A | A | A |
| Die Bonding Agent |  | D | D | D | D | E | F | A# | D | D | D | D |
| Forming position of the adhesive resin |  |  |  |  |  |  |  |  |  |  |  |  |
| Upper face of semiconductor chip |  | — | — | — | ○ | ○ | ○ | ○ | ○ | — | ○ | ○ |
| Lower face of semiconductor chip |  | ○ | ○ | ○ | ○ | ○ | ○ | ○ | ○ | — | — | ○ |
| Side faces of semiconductor chip |  | — | — | — | — | — | — | — | ○ | — | — | ○ |
| Upper face of die pad |  | ○ | ○ | ○ | ○ | ○ | ○ | ○ | ○ | ○ | — | — |
| Lower face of die pad |  | — | — | — | ○ | ○ | ○ | ○ | ○ | — | ○ | ○ |
| Side faces of die pad |  | — | — | — | — | — | — | — | ○ | — | — | ○ |
| Thickness of each adhesive resin layer (μm) |  | 1 | 10 | 20 | 10 | 10 | 10 | 10 | 10 | 10 | 10 | 10 |
| Occurrence of cracks after VPS treatment (Numbers of failures/total numbers) |  | 0/20 | 0/20 | 0/20 | 0/20 | 0/20 | 0/20 | 0/20 | 0/20 | 0/20 | 20/20 | 15/20 |
|  | (PCT treatment time) |  |  |  |  |  |  |  |  |  |  |  |
| Moisture resistance after VPS-PCT treatment (Number of failures/total numbers) | 50H | 0/20 | 0/20 | 0/20 | 0/20 | 0/20 | 0/20 | 0/20 | 0/20 | 0/20 | 0/20 | 0/20 |
|  | 100H | 0/20 | 0/20 | 0/20 | 0/20 | 0/20 | 0/20 | 0/20 | 0/20 | 0/20 | 0/20 | 0/20 |
|  | 200H | 0/20 | 0/20 | 0/20 | 0/20 | 0/20 | 0/20 | 0/20 | 0/20 | 0/20 | 0/20 | 0/20 |
|  | 300H | 0/20 | 0/20 | 0/20 | 0/20 | 0/20 | 0/20 | 0/20 | 0/20 | 0/20 | 6/20 | 0/20 |
|  | 400H | 3/20 | 1/20 | 1/20 | 0/20 | 0/20 | 1/20 | 0/20 | 0/20 | 0/20 | 16/20 | 12/20 |
|  | 500H | 7/20 | 3/20 | 5/20 | 1/20 | 2/20 | 1/20 | 1/20 | 0/20 | 0/20 | 20/20 | 16/20 |

*Shape of Samples
Chip Size 15 × 15 × 0.45 mm□
Bed Size 15.5 × 15.5 × 0.15 mm□
Package QFP-184 Pin
*Encapsulating resin A# is obtained by processing A into a form of a sheet

TABLE 4

|  |  | Preparation Example |  |  | Comparative Example |  |
|---|---|---|---|---|---|---|
|  |  | 10 | 11 | 12 | 3 | 4 |
| Encapsulating Resin |  | A | A | A | A | A |
| Die Bonding Agent |  | D | D | D | D | D |
| Forming position of Adhesive Resin Layer |  |  |  |  |  |  |
| Lower face of semiconductor chip |  | ○ | ○ | ○ | — | — |
| Upper face of die pad |  | — | ○ | — | — | — |
| Thickness of Adhesive Resin Layer (μm) |  | 10 | 10 | 10 | — | — |
| Processing of Die Pad |  | — | Round shape | Square shape | Round shape | Square shape |
| Occurrence of Cracks after VPS Treatment (Numbers of failures/Total numbers) |  | 1/20 | 0/20 | 0/20 | 15/20 | 17/20 |
|  | (PCT treatment time) |  |  |  |  |  |
| Moisture Resistance after VPS-PCT Treatment (Numbers of failures/Total numbers) | 50H | 0/20 | 0/20 | 0/20 | 0/20 | 0/20 |
|  | 100H | 0/20 | 0/20 | 0/20 | 0/20 | 0/20 |
|  | 200H | 0/20 | 0/20 | 0/20 | 1/20 | 0/20 |
|  | 300H | 0/20 | 0/20 | 0/20 | 5/20 | 7/20 |
|  | 400H | 2/20 | 0/20 | 0/20 | 18/20 | 15/20 |
|  | 500H | 5/20 | 0/20 | 1/20 | 20/20 | 20/20 |

TABLE 5

| Raw material | | Encapsulating Resin (Die Bonding Agent) | | |
|---|---|---|---|---|
| | | G (J,K,L) | H (M) | I (N) |
| <Epoxy Resin> | | | | |
| Biphenyl epoxy resin (YX-4000H manufactured by Yuka Shell Epoxy Co.) | | 10.1 | 2.6 | — |
| Trifunctional epoxy resin (ESX-221 manufactured by Sumitomo Chemical Co.) | | — | — | 10.3 |
| Brominated bisphenol A-type epoxy resin (AER-755T manufactured by Asahi Chemical Industry Co.) | | 2.5 | 2.5 | 2.5 |
| <Maleimide Resin> | | | | |
| Diphenylmethane-N,N'-bismaleimide (Molecular weight 358) | | — | 6.9 | — |
| <Curing Agent> | | | | |
| Phenolic novolak resin (BRG-556 manufactured by Showa High polymer Co.) | | 6.0 | — | — |
| Trifunctional phenolic resin (YL-6065 manufactured by Yuka Shell Epoxy Co.) | | — | — | 5.8 |
| 1,3-bis(4-amino phenoxy)benzene | | — | 5.9 | — |
| <Curing Accelerator> | | | | |
| Triphenyl phosphine | | 0.2 | 0.1 | — |
| Dicumyl peroxide | | — | 0.1 | — |
| Imidazole | | — | — | 0.3 |
| <Filler> | Fused silica powder | 76.0 | 76.7 | 77.9 |
| <Releasing Agent> | Carnauba wax | 0.4 | 0.4 | 0.4 |
| <Treating Agent> | Coupling agent (A-187) | 0.5 | 0.5 | 0.5 |
| <Pigment> | Carbon black | 0.3 | 0.3 | 0.3 |
| <Flame Retardent> | Antimony trioxide | 2.0 | 2.0 | 2.0 |
| <Low-stress Modifier> | Methylmethacrylate-styrene-butadiene copolymer | 2.0 | 2.0 | 2.0 |
| (Characteristics) | | | | |
| Thermal Expansion Coefficient ($\times 10^{-5}$/°C.) | | 1.5 | 1.3 | 1.5 |
| Thermal Stress (kg/mm$^2$) | | 2.8 | 3.8 | 3.4 |
| Glass Transition Temperature (°C.) | | 150 | 220 | 200 |
| Adhesive Strength under shear (Room temperature, kg/mm$^2$) | *Semiconductor chip | 3 | 2 | 2 |
| | *42 alloy lead Frame | 2 | 1 | 0.5 |

TABLE 6

| | | Preparation Example | | | Comparative Example |
|---|---|---|---|---|---|
| | | 13 | 14 | 15 | 5 |
| Encapsulating Resin | | G | G | H | G |
| Die Bonding Agent | | J | K | M | Commercially available products |
| Occurrence of cracks after VPS treatment (Numbers of failures/total numbers) | | 0/20 | 0/20 | 0/20 | 15/20 |
| | (PCT treatment time) | | | | |
| Moisture resistance after VPS-PCT treatment (Numbers of failures/total numbers) | 50H | 0/20 | 0/20 | 0/20 | 0/20 |
| | 100H | 0/20 | 0/20 | 0/20 | 0/20 |
| | 200H | 0/20 | 0/20 | 0/20 | 0/20 |
| | 300H | 0/20 | 0/20 | 0/20 | 1/20 |
| | 400H | 1/20 | 0/20 | 1/20 | 5/20 |
| | 500H | 5/20 | 4/20 | 5/20 | 10/20 |

*Shape of Samples
Chip Size 15 × 15 × 0.45 mm□
Die Pad Size 15.5 × 15.5 × 0.15 mm□
QFP-184 Pin

TABLE 7

|  | Preparation Example | | | |
|---|---|---|---|---|
|  | 16 | 17 | 18 | 19 |
| Encapsulating Resin | G | G | G | I |
| Die Bonding Agent | J | L | J | N |
| Forming position of the adhesive resin | | | | |
| Upper face of semiconductor chip | — | — | o | o |
| Lower face of semiconductor chip | o | o | o | o |
| Side faces of semiconductor chip | — | — | — | o |
| Upper face of die pad | o | o | o | o |
| Lower face of die pad | — | — | o | o |
| Side faces of die pad | — | — | — | o |
| Thickness of each adhesive resin layer (μm) | 10 | 10 | 10 | 10 |
| Occurrence of cracks after VPS treatment (Numbers of failures/total numbers) | 0/20 | 0/20 | 0/20 | 0/20 |
| Moisture resistance after VPS-PCT treatment (Numbers of failures/total numbers) (PCT treatment time) 50H | 0/20 | 0/20 | 0/20 | 0/20 |
| 100H | 0/20 | 0/20 | 0/20 | 0/20 |
| 200H | 0/20 | 0/20 | 0/20 | 0/20 |
| 300H | 0/20 | 0/20 | 0/20 | 0/20 |
| 400H | 0/20 | 0/20 | 0/20 | 0/20 |
| 500H | 2/20 | 2/20 | 0/20 | 0/20 |

*Shape of Samples
Chip Size 15 × 15 × 0.45 mm□
Die Pad Size 15.5 × 15.5 × 0.15 mm□
QFP-184 Pin

TABLE 8

| Raw Material | | Die Bonding Agent | | | | |
|---|---|---|---|---|---|---|
| | | O | P | Q | R | S |
| <Epoxy Resin> | | | | | | |
| Biphenyl epoxy resin (YX-4000H manufactured by Yuka Shell Epoxy Co.) | | 17.0 | 13.3 | 6.4 | 3.8 | 19.7 |
| Brominated bisphenol A-type epoxy resin (AER-755T manufactured by Asahi Chemical Industry Co.) | | 4.2 | 3.3 | 1.6 | 0.9 | 4.9 |
| <Curing Agent> | | | | | | |
| Phenolic novolak resin (BRG-556 manufactured by Showa High polymer Co.) | | 10.1 | 7.9 | 3.8 | 2.2 | 11.7 |
| <Curing Accelerator> | | | | | | |
| Triphenyl phosphine | | 0.34 | 0.22 | 0.13 | 0.08 | 0.39 |
| <Filler> | Fused silica powder | 63.0 | 70.0 | 83.0 | 88.0 | 58.0 |
| <Releasing Agent> | Carnauba wax | 0.5 | 0.4 | 0.3 | 0.2 | 0.6 |
| <Treating Agent> | Coupling agent | 0.5 | 0.5 | 0.5 | 0.5 | 0.5 |
| <Pigment> | Carbon black | 0.3 | 0.3 | 0.3 | 0.3 | 0.3 |
| <Flame Retardent> | Antimony trioxide | 2.0 | 2.0 | 2.0 | 2.0 | 2.0 |
| <Low-stress Modifier> | Methylmethacrylate-styrene-butadiene copolymer | 2.0 | 2.0 | 2.0 | 2.0 | 2.0 |
| (Characteristics) | | | | | | |
| Thermal expansion Coefficient (× $10^{-5}$/°C.) | | 2.2 | 1.8 | 1.0 | 0.8 | 2.7 |
| Thermal Stress (kg/mm²) | | 3.2 | 2.8 | 2.0 | 1.6 | 3.4 |
| Glass Transition Temperature (°C.) | | 150 | 150 | 150 | 150 | 150 |
| Adhesive Strength under shear (Room temperature) kg/mm² | *Semiconductor chip | 3 | 3 | 3 | 2.5 | 3 |
| | *42 alloy lead Frame | 2 | 2 | 1.5 | 1.0 | 2 |

TABLE 9

|  | Preparation Example | | | | Comparative Example |
|---|---|---|---|---|---|
|  | 20 | 21 | 22 | 23 | 6 |
| Encapsulating Resin | G | G | G | G | G |
| Die Bonding Agent | O | P | Q | R | S |
| Forming position of the adhesive resin | | | | | |
| Upper face of semiconductor chip | o | o | o | o | o |
| Lower face of semiconductor chip | o | o | o | o | o |
| Side faces of semiconductor chip | o | o | o | o | o |
| Upper face of die pad | o | o | o | o | o |
| Lower face of die pad | o | o | o | o | o |
| Side faces of die pad | o | o | o | o | o |
| Thickness of each adhesive resin layer (μm) | 10 | 10 | 10 | 10 | 10 |
| Occurrence of cracks after VPS treatment (Numbers of failures/total number) (PCT treatment time) | 0/20 | 0/20 | 0/20 | 0/20 | 0/20 |
| Moisture resist- 50H | 0/20 | 0/20 | 0/20 | 0/20 | 0/20 |

TABLE 9-continued

|  |  | Preparation Example | | | | Comparative Example |
| --- | --- | --- | --- | --- | --- | --- |
|  |  | 20 | 21 | 22 | 23 | 6 |
| ance after VPS- | 100H | 0/20 | 0/20 | 0/20 | 0/20 | 1/20 |
| PCT treatment | 200H | 0/20 | 0/20 | 0/20 | 0/20 | 1/20 |
| (Numbers of | 300H | 0/20 | 0/20 | 0/20 | 0/20 | 2/20 |
| failures/total | 400H | 1/20 | 1/20 | 0/20 | 0/20 | 2/20 |
| numbers) | 500H | 2/20 | 1/20 | 0/20 | 0/20 | 4/20 |

*Shape of Samples
Chip Size 15 × 15 × 0.45 mm□
Bed Size 15.5 × 15.5 × 0.15 mm□
QFP-184 Pin

What is claimed is:

1. A resin-encapsulated semiconductor device having a semiconductor chip mounted on a die pad with a die bonding portion interposed, a lead arranged in a periphery of said die pad and electrically connected with a bonding pad portion of said semiconductor chip, and an encapsulating resin layer which encapsulates said semiconductor chip so that a part of said lead is guided outside said resin layer, wherein an adhesive resin layer is interposed at least either between said die pad and said die bonding portion, or between said semiconductor chip and said die bonding portion wherein said die bonding portion comprises a resin and wherein the adhesiveness of said adhesive resin layer to the die pad and/or the semiconductor chip is higher than that of the die bonding portion.

2. A semiconductor device as set forth in claim 1, wherein the adhesive resin layer is interposed between the semiconductor chip and the die bonding portion.

3. A semiconductor device as set forth in claim 1, wherein the adhesive resin layer is interposed between the die pad and the die bonding portion.

4. A semiconductor device as set forth in claim 1, wherein the adhesive resin layer is interposed between the semiconductor chip and the die bonding portion and between the die pad and the die bonding portion.

5. A semiconductor device as set forth in claim 1, wherein the adhesive resin layer is interposed between the upper face of the semiconductor chip and the encapsulating resin layer, between the semiconductor chip and the die bonding portion, between the die bonding portion and the die pad and between the lower face of the die pad and the encapsulating resin layer.

6. A semiconductor device as set forth in claim 1, wherein the adhesive resin layer is interposed between an upper face and a side face of the semiconductor chip and the encapsulating resin layer, between the semiconductor chip and the die bonding portion, between the side face of the die bonding portion and the encapsulating resin layer, between the die bonding portion and the die pad and between a lower face and the side face of the die pad and the encapsulating resin layer.

7. A semiconductor device as set forth in claim 2, wherein the die pad has a hole.

8. A semiconductor device as set forth in claim 4, wherein the die pad has a hole.

9. A semiconductor device as set forth in claim 1, wherein the thickness of the adhesive resin layer is about 20 um or less.

10. A semiconductor device as set forth in claim 1, wherein the resin constituting the adhesive resin layer is a resin of at least one member selected from the group consisting of thermosetting resins, photosetting resins and thermoplastic resins.

11. A semiconductor device as set forth in claim 1, wherein the resin constituting the adhesive resin layer is a resin of at least one member selected from the group consisting of thermosetting polyimide resins, epoxy resins, polyester resins, silicone resins, polybutadien resins, diallylphthalate resins, acryl resins, thermoplastic polyimide resins, a polyamide resin, a polyamideimide resin, a polyether imide resin, ABS resins and phenoxy resins.

12. A semiconductor device as set forth in claim 1, wherein the resin constituting the adhesive resin layer is a thermosetting or thermoplastic polyimide resin.

13. The semiconductor device according to claim 1, wherein said adhesive resin layer is formed by coating at least either a lower face of the semiconductor chip or an upper face of the die pad with a liquid adhesive resin and contacting the coated face with said die bonding portion.

14. The semiconductor device according to claim 1, wherein said adhesive resin layer is polyimide.

15. A semiconductor device as claimed in claim 1, wherein said encapsulating resin layer is formed of an epoxy resin containing an additive, said die bonding agent comprises at least one resin selected from the group consisting of an epoxy resin and a maleimide resin, and said adhesive resin consists of a polyimide resin.

16. A semiconductor device as set forth in claim 1, wherein a thermal expansion coefficient of the die bonding agent constituting the die bonding portion is in a range of ±50% of the thermal expansion coefficient of the encapsulating resin layer.

17. A resin-encapsulated semiconductor device having a semiconductor chip mounted on a die pad with a die bonding portion interposed, a lead arranged in a periphery of said die pad and electrically connected with a bonding pad portion of said semiconductor chip, and an encapsulating resin layer which encapsulates said semiconductor chip so that a part of said lead is guided outside said resin layer, wherein a thermal expansion coefficient of a die bonding agent constituting said die bonding portion is in a range of ±50% of the thermal expansion coefficient of said encapsulating resin layer and wherein said die bonding portion comprises a resin.

18. A semiconductor device as set forth in claim 17, wherein the thermal expansion coefficient of the die bonding agent is about $0.5 \times 10^{-5}$ to $2.2 \times 10^{-5}/°$ C.

19. A semiconductor device as set forth in claim 17, wherein the resin constituting the encapsulating resin layer and the die bonding agent are the same resin.

20. A resin encapsulated semiconductor device comprising a semiconductor chip mounted on a die pad with a die bonding portion interposed, a lead arranged in a periphery of said die pad and electrically connected with a bonding pad portion of said semiconductor chip, and an encapsulating resin layer which encapsulates said semiconductor chip so that a part of said lead is guided outside said resin layer, wherein an adhesive resin layer is interposed at least either between said die pad and said die bonding portion, or between said semiconductor chip and said die bonding portion wherein said die bonding portion is formed of a resin composition comprising a resin and an electroconductivity-imparting agent.

21. A resin-encapsulated semiconductor device comprising a semiconductor chip mounted on a die pad with a die bonding portion interposed, a lead arranged in a periphery of said die pad and electrically connected with a bonding pad portion of said semiconductor chip, and an encapsulating resin layer which encapsulates said semiconductor chip so that a part of said lead is guided outside said resin layer, wherein a thermal expansion coefficient of a die bonding agent constituting said die bonding portion is in a range of ±50% of the thermal expansion coefficient of said encapsulating layer resin layer and wherein said die bonding agent is formed of a resin composition comprising a resin and an electroconductivity-imparting agent.

22. A resin-encapsulated semiconductor device having a semiconductor chip mounted on a die pad with a die bonding portion interposed, a lead arranged in a periphery of said die pad and electrically connected with a bonding pad portion of said semiconductor chip, and an encapsulating resin layer which encapsulates said semiconductor chip so that a part of said lead is guided outside said resin layer, wherein an adhesive resin layer is interposed at least either between said die pad and said die bonding portion, or between said semiconductor chip and said die bonding portion, said die bonding portion comprising a resin, and wherein said adhesive resin layer is formed by coating at least either a lower face of the semiconductor chip or an upper face of the die pad with a liquid adhesive resin and contacting the coated face with said die bonding portion.

* * * * *